United States Patent [19]

Weick

[11] Patent Number: 4,814,638

[45] Date of Patent: Mar. 21, 1989

[54] HIGH SPEED DIGITAL DRIVER WITH SELECTABLE LEVEL SHIFTER

[75] Inventor: John M. Weick, Centerport, N.Y.

[73] Assignee: Grumman Aerospace Corporation, Bethpage, N.Y.

[21] Appl. No.: 59,075

[22] Filed: Jun. 8, 1987

[51] Int. Cl.$^4$ .................. H03K 3/01; H03K 19/02; H03K 5/153

[52] U.S. Cl. .................. 307/270; 307/473; 307/350; 307/264

[58] Field of Search ............... 307/270, 475, 473, 350, 307/530, 264

[56] References Cited

U.S. PATENT DOCUMENTS

| 3,604,952 | 2/1970 | Regitz | 307/264 |
|---|---|---|---|
| 3,671,763 | 5/1972 | Maley et al. | 328/205 |
| 3,671,764 | 5/1972 | Maley et al. | 307/473 |
| 3,742,253 | 6/1973 | Kronies | 307/473 |
| 3,757,231 | 9/1973 | Faustini | 328/37 |
| 3,906,255 | 9/1975 | Mensch, Jr. | 307/473 |
| 4,042,840 | 8/1977 | Chan | 307/270 |
| 4,207,792 | 5/1980 | Hoskinson | 328/205 |
| 4,280,065 | 7/1981 | Minato et al. | 307/473 |
| 4,339,673 | 7/1982 | Perry | 307/270 |
| 4,363,978 | 12/1982 | Heimbigner | 307/473 |
| 4,449,064 | 5/1984 | Eckert et al. | 307/473 |
| 4,477,741 | 10/1984 | Moser, Jr. | 307/473 |
| 4,488,067 | 12/1984 | Kraft et al. | 307/473 |
| 4,649,297 | 3/1987 | Vazehgoo | 307/270 |
| 4,694,202 | 9/1987 | Iwamura et al. | 307/270 |

OTHER PUBLICATIONS

"Read-Select Capability for Static Random-Access Memory," IBM Technical Disclosure Bulletin, vol. 27, No. 11, Apr. 1985, pp. 6640-6642.

"Tristate Programmable Driver Circuit," IBM Technical Disclosure Bulletin, vol. 20, No. 2, Jul. 1977, pp. 766-768.

"Electronic Engineering," vol. 52, No. 634, Feb. 1980, p. 29.

Primary Examiner—Stanley D. Miller
Assistant Examiner—M. R. Wambach
Attorney, Agent, or Firm—Pollock, Vande Sande & Priddy

[57] ABSTRACT

A driver is utilized at the output of a digital word generator for translating a digital word to selectable voltage levels in accordance with a particular unit connected to the output of the driver and undergoing diagnostic testing. The driver has a separate control line for switching the driver to a tri-state mode so that the input of a unit undergoing test may be switched to a high impedance input, thereby permitting tri-state diagnostic testing of a unit undergoing test.

4 Claims, 1 Drawing Sheet

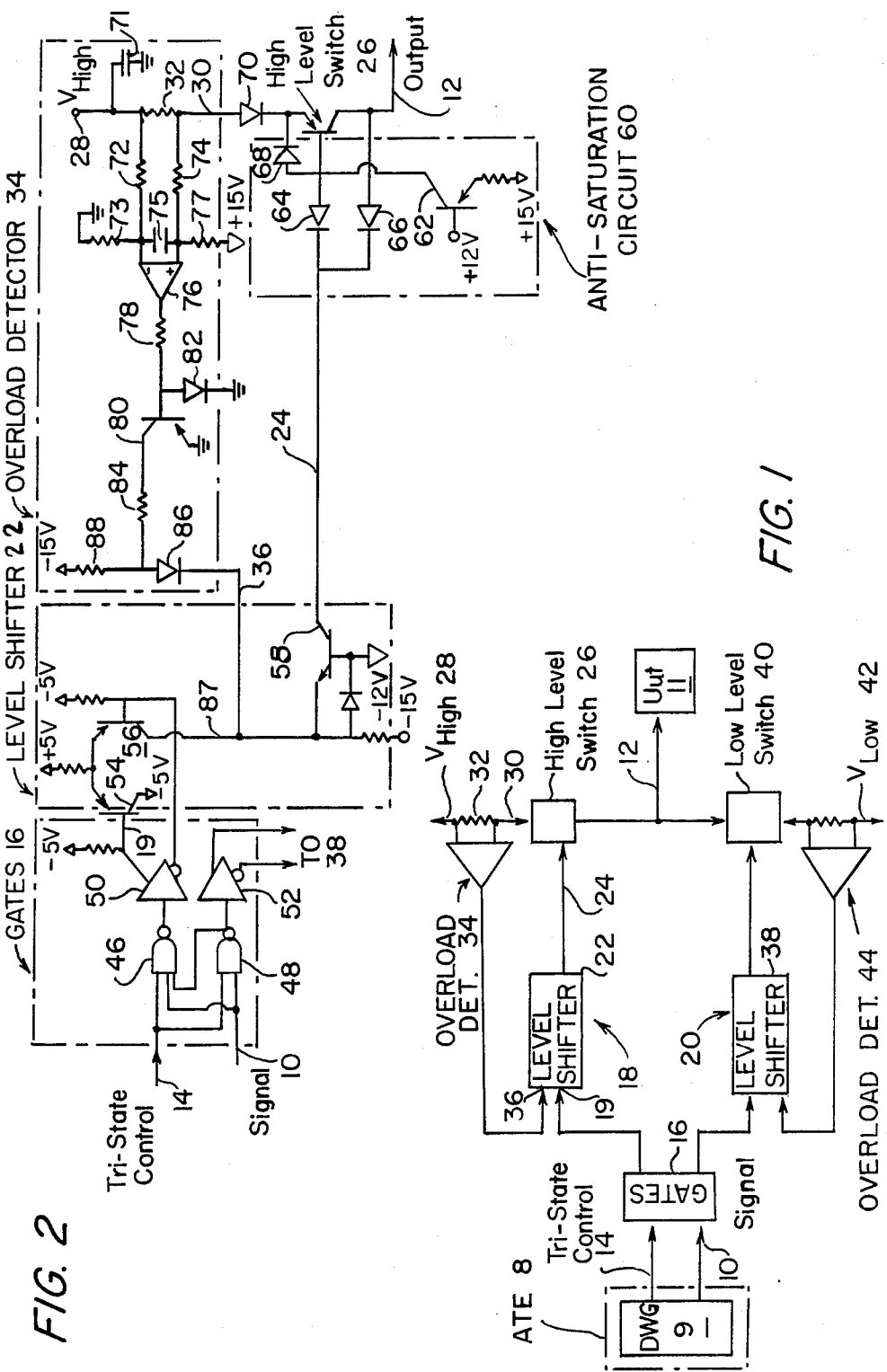

HIGH SPEED DIGITAL DRIVER WITH SELECTABLE LEVEL SHIFTER

FIELD OF THE INVENTION

The present invention relates to digital drivers, and more particularly to such a driver capable of translating digital signals to different voltage levels in accordance with programmed reference inputs.

BACKGROUND OF THE INVENTION

Military facilities, including shipboard electronic instrumentation, require frequent testing and calibration in order to operate reliably. Efforts have been made in recent years to develop a single testing apparatus which is capable of testing a wide variety of electronic devices. The advantage to such an approach is to avoid the cost and inconvenience of having individual test equipment for electronic devices to be tested.

Generally, such test apparatus, known as automatic test equipment (ATE), will provide a parallel digital output to a device or unit undergoing test (UUT). As test data is generated by the automatic test equipment, the response of a connected UUT is detected and compared to an expected response. Failure to respond properly uncovers a fault with the UUT.

The problem with available prior art test equipment is a relatively low operating speed and the lack of conveniently testing the capability of a UUT to operate in a tri-state condition.

BRIEF DESCRIPTION OF THE PRESENT INVENTION

The present invention offers a high-speed hybrid digital driver which interfaces TTL digital word generators (DWG) with UUT's.

The present invention provides capability of converting the DWG signals which are TTL level signals into signals whose upper and lower voltage levels are programmable. The timing is provided by the DWG. That is, the present invention does not modify the duration of the "ONES" and "ZEROS." However, the amplitude of the ONE and likewise the amplitude of the ZERO are provided as reference voltages to the driver. Thus, the needs of a UUT for special levels of digital signals can be satisfied. In addition, the driver also provides additional driving power beyond that available from the TTL output chip in the DWG itself.

Further, the present driver includes a control input which allows the driver output to be put into a tri-state mode, independent of the state of the signal input.

Accordingly, the present high speed digital driver offers the user great versatility and enables a large variety of UUT's to be fully tested by a single ATE.

BRIEF DESCRIPTION OF THE FIGURES

The above-mentioned objects and advantages of the present invention will be more clearly understood when considered in conjunction with the accompanying drawings, in which:

FIG. 1 is a block diagram of the present high speed digital driver which interfaces between a digital word generator and a unit undergoing test; and FIG. 2 is a schematic view of a first channel of the driver circuit.

DETAILED DESCRIPTION OF THE INVENTION

FIG. 1 illustrates a basic block diagram of the present invention.

The presence of an automatic test equipment (ATE) is indicated by reference numeral 8. This ATE 8 is conventional; and briefly, it generates logic patterns or data words which are to be transmitted to the input of a unit undergoing test (UUT) 11. Since each type of UUT generally requires different logic patterns to complete a test, the ATE 8 is microprocessor based in order to generate the necessary logic patterns in the form of digital words, depending upon the particular UUT 11 being tested. Within a conventional ATE 8, a plurality of digital word generators (DWG) 9 is provided to generate digital words in simulation of the logic pattern to be input to the UUT 11. If a parallel output is provided by an ATE 8, a separate DWG 9 must be provided for each of the parallel outputs. Otherwise stated, since the ATE 8 generates a data word comprised of a number of bits, a separate DWG 9 is provided for each bit.

The hybrid circuitry shown connected between the output of DWG 9 and the input of UUT 11 serves to translate the logic levels generated by the DWG 9 and presents such translated levels to the input of UUT 11, as is required by the latter unit in order to complete a test. As previously mentioned, different types of UUT's 11 with require inputs of different binary levels. Thus, the present invention must be capable of generating selectable input levels for the UUT 11. Other than this selectable level change, the driver of the present invention is not intended to change the pulse width or shape of the single bit signal provided at the DWG 9.

With this brief introduction to the invention, further reference is made to FIG. 1 wherein the signal flow through the driver circuit of the invention will now be discussed.

The signal from the DWG 9 appears as an input to a gate network 16. In the event the tri-state control line 14 does not carry a control signal from DWG 9, the signal at input line 10 will pass to upper and lower paths 18 and 20 of the driver to translate the voltage levels from the DWG 9 to selectable levels for the UUT 11, as will be presently explained. However, in the event that the DWG 9 does generate a tri-state control signal on line 14, the gate network 16 will open, thereby conditioning the driver output 12 to enter a tri-state mode for the UUT 11. As is known by those skilled in the art, such a tri-state mode at the input of the UUT is accompanied by a high impedance, no signal condition. The present driver circuitry simulates such a tri-state mode, regardless of the high speed signal appearing on line 10. Considering the upper or high level signal path 18, the signal on line 10 passes through the gate network 16 to input 19 of level shifter 22. The level shifter converts conventional TTL low logic levels from the DWG 9 to a more acceptable level to be utilized by a typical UUT 11. The output from level shifter 22 is connected with the input of a transistor switch 26 which will open and close in accordance with the high binary levels of the original input signal on line 10.

An important aspect of the present invention is that the output of switch 26 has a selectable amplitude in accordance with a high reference voltage at terminal 28 connected to another input 30 of switch 26 via a load sense resistor 32. By varying the voltage at 28, the high level of the original input signal will be correspondingly altered at the driver circuit output 12, connected to the input of the UUT 11. In a preferred embodiment of the present invention, the high level voltage at 28 is programmed by a computer (not shown) in accordance with the particular UUT 11 being tested.

Short circuit protection through the driver is provided by an overload detector 34 having its input connected across the load resistor 32. The output from detector 34 is connected at a second input 36 of level shifter 22 so that the occurrence of an overload condition, as sensed across resistor 32, opens the circuit path through level shifter 22 thereby preventing component destruction.

The lower signal path for the digital word provided to UUT 11 at driver output 12 is generally indicated by reference numeral 20 and is seen to include the same type of level shifter 38, switch 40, and overload detector 44 as was present in connection with the upper signal path 18. In order to properly select the low level of the signal input to UUT 11, a programmable low level voltage is introduced to the driver circuit at 42.

FIG. 2 is an elaboration of the driver circuitry which has been explained in connection with FIG. 1. The reference numerals are the same for similar components indicated in the figures. The gate network 16 is seen to include parallel connected gatses 46 and 48 which respectively drive inverters 50 and 52. The output from inverter 50 drives the high level shifter 22, while the inverter 52 drives the low level shifter 38. The level shifter 22 is seen to include transistors 54 and 56 having their emitters connected in parallel. The collector of transistor 56 drives transistor 58 which produces the level shifted pulses from the original signal on input line 10. The level shifted pulses are then transmitted, along line 24, to a high voltage level transistor switch 26 via a circuit 60 which prevents saturation of transistor switch 26. The anti-saturation circuit 60 is of conventional design and includes diodes 64, 66, 68 and transistor 62 connected across the terminals of the transistor switch 26. The programmable and selectable high input voltage at terminal 28 drives the emitter of transistor switch 26 via diode 70, the latter ensuring proper voltage polarity at the emitter of the transistor switch 26. The collector of the transistor serves as the output of the driver circuit; then, as shown in FIG. 1, it is connected to a UUT 11. The inclusion of capacitor 71 across terminal 28 ensures a bypass route for spurious noise.

The overload detector 34 is shown in greater detail in FIG. 2. The load resistor 32 is seen to drive the inputs of an operational amplifier 76 via input resistors 72 and 74 which are connected across capacitor 75 and respective input parallel grounded resistors 73 and 77. Utilization of these latter-discussed resistors and capacitor filter undesirable noise from the input of the operational amplifier 76. In the event a short circuit or overload condition is detected by virtue of an inordinately high voltage across resistor 32, output current from the operational amplifier 76 generates a voltage across resistor 78 which is grounded, via diode 82. This developed voltage is then amplified by transistor 80 and transistor load resistor 84. Transistor 80 is collector biased via resistor 88. When an overload signal is generated at the output of transistor 80, it is communicated, via diode 86, to lead 87 in connecting level shifter transistors 56 and 58. In such a circumstance, the current path through the level shifter 22 is interrupted until the overload or short circuit condition is changed.

By virtue of the previous description, the present invention is seen to offer a high speed hybrid digital driver which is capable of generating selectable voltage levels for a UUT 11; and upon generation of a proper tri-state control signal at 14, the driver will enter a tri-state mode and appear as a high impedance non-communicating connection to the input of a UUT during portions of a test when a tri-state input to the UUT 11 is desired.

Responses by the UUT 11 are customarily input to a CPU (not shown) for analysis which, per se, does not form part of the present invention.

It should be understood that the invention is not limited to the exact details of construction shown and described herein, for obvious modifications will occur to persons skilled in the art.

I claim:

1. A digital driver for variably translating low level input signals from an automatic test equipment to programmable levels acceptable to a unit undergoing test, the driver having two parallel paths for respectively processing first and second binary bit levels of the input signal, each path comprising:

means for shifting the low level input by a fixed amount;

a variable voltage potential;

switching means connected at a control terminal to an output of the level shifting means for switching the switching means in synchronism with the input signal;

means connecting the voltage potential to the switching means for generating a signal with a translated level at an output of the switching means;

means connecting an output of the switching means to an input of a unit undergoing test so that the outputs of the switching means for the two parallel paths are connected together thus providing an output binary signal corresponding to and in synchronism with the input signal but wherein the levels of the output binary signal are dependent upon respective voltage potentials.

2. The structure set forth in claim 1 together with gating means connected at an output thereof to an input of each level shifting means, the input signal provided at the input of the gating means for passage to the parallel paths;

the gating means having a tri-state control input for opening the gating means and producing a high output impedance at the switching means output regardless of the input signal.

3. The structure set forth in claim 2 together with means associated with each path and connected to the means connecting the voltage potential to the switching means for detecting an overload condition, an output of the detecting means connected to the level shifting means for opening the path until the overload condition is corrected.

4. The structure set forth in claim 3 together with means connected to the switching means for preventing saturation of the switching means.

* * * * *

UNITED STATES PATENT AND TRADEMARK OFFICE
CERTIFICATE OF CORRECTION

PATENT NO. : 4,814,638

DATED : March 21, 1989

INVENTOR(S) : John M. Weick

It is certified that error appears in the above-identified patent and that said Letters Patent is hereby corrected as shown below:

Column 2, line 30, change "with" to --will--.

Column 3, line 27, change "gatses" to --gates--.

Signed and Sealed this

Fifth Day of December, 1989

Attest:

JEFFREY M. SAMUELS

*Attesting Officer*    *Acting Commissioner of Patents and Trademarks*